United States Patent
Yokouchi

(10) Patent No.: US 8,686,320 B2
(45) Date of Patent: Apr. 1, 2014

(54) HEAT TREATMENT APPARATUS EMITTING FLASH OF LIGHT

(75) Inventor: Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/298,892

(22) Filed: Nov. 17, 2011

(65) Prior Publication Data
US 2012/0063751 A1    Mar. 15, 2012

Related U.S. Application Data

(63) Continuation of application No. 11/970,002, filed on Jan. 7, 2008, now Pat. No. 8,173,937.

(30) Foreign Application Priority Data

Feb. 9, 2007 (JP) .................................. 2007-029926

(51) Int. Cl.
H01L 21/26    (2006.01)
F27B 5/14    (2006.01)
F27B 5/18    (2006.01)
F27D 11/02    (2006.01)

(52) U.S. Cl.
USPC ........... 219/411; 219/412; 219/482; 392/411; 438/795

(58) Field of Classification Search
None
See application file for complete search history.

(56) References Cited

U.S. PATENT DOCUMENTS

| | | | |
|---|---|---|---|
| 4,698,486 A | 10/1987 | Sheets | |
| 6,570,656 B1 | 5/2003 | Owens et al. | |
| 6,737,367 B1 * | 5/2004 | Drechsler et al. | 438/795 |
| 6,798,142 B2 | 9/2004 | Eguchi | |
| 6,849,831 B2 | 2/2005 | Timans et al. | |
| 6,885,815 B2 | 4/2005 | Kusuda et al. | |
| 6,936,797 B2 | 8/2005 | Hosokawa | |
| 6,951,996 B2 | 10/2005 | Timans et al. | |
| 6,970,644 B2 * | 11/2005 | Koren et al. | 392/418 |
| 6,998,580 B2 | 2/2006 | Kusuda et al. | |

(Continued)

FOREIGN PATENT DOCUMENTS

| JP | 2001-319887 | 11/2001 |
|---|---|---|
| JP | 2001-319891 | 11/2001 |

(Continued)

OTHER PUBLICATIONS

JP 2004-200204 A, Kasuda, Jul. 2004, partial translation.*

(Continued)

Primary Examiner — Joseph M Pelham
(74) Attorney, Agent, or Firm — Ostrolenk Faber LLP

(57) ABSTRACT

Flash lamps connected to short-pulse circuits and flash lamps connected to long-pulse circuits are alternately arranged in a line. The duration of light emission from the flash lamps connected to the long-pulse circuits is longer than the duration of light emission from the flash lamps connected to the short-pulse circuits. A superimposing of a flash of light with a high peak intensity from the flash lamps that emit light for a short time and a flash of light with a gentle peak from the flash lamps that emit light for a long time can increase the temperature of even a deep portion of a substrate to an activation temperature or more without heating a shallow portion near the substrate surface more than necessary. This achieves the activation of deep junctions without causing substrate warpage or cracking.

2 Claims, 12 Drawing Sheets

(56) References Cited

U.S. PATENT DOCUMENTS

| | | | |
|---|---|---|---|
| 7,183,229 B2* | 2/2007 | Yamanaka | 438/795 |
| 7,317,870 B2* | 1/2008 | Timans et al. | 392/416 |
| 7,800,081 B2* | 9/2010 | Moffatt et al. | 250/492.2 |
| 8,000,587 B2* | 8/2011 | Timans et al. | 392/411 |
| 8,005,351 B2* | 8/2011 | Camm et al. | 392/416 |
| 2002/0179589 A1 | 12/2002 | Morita et al. | |
| 2002/0195437 A1 | 12/2002 | Kusuda | |
| 2003/0013280 A1* | 1/2003 | Yamanaka | 438/487 |
| 2003/0235972 A1 | 12/2003 | Hosokawa | |
| 2004/0009632 A1 | 1/2004 | Tanabe et al. | |
| 2004/0013418 A1 | 1/2004 | Kusuda et al. | |
| 2004/0037543 A1 | 2/2004 | Kusuda et al. | |
| 2004/0149715 A1 | 8/2004 | Timans et al. | |
| 2005/0236395 A1 | 10/2005 | Timans et al. | |
| 2005/0258162 A1 | 11/2005 | Kusuda et al. | |
| 2006/0096677 A1* | 5/2006 | Camm et al. | 148/565 |
| 2006/0189034 A1 | 8/2006 | Tanabe et al. | |
| 2006/0225657 A1 | 10/2006 | Mizushima | |
| 2006/0249078 A1 | 11/2006 | Nowak et al. | |
| 2007/0069161 A1* | 3/2007 | Camm et al. | 250/504 R |
| 2007/0087492 A1 | 4/2007 | Yamanaka | |
| 2008/0069550 A1 | 3/2008 | Timans et al. | |
| 2008/0143268 A1 | 6/2008 | Torikai et al. | |
| 2008/0273867 A1 | 11/2008 | Camm et al. | |

FOREIGN PATENT DOCUMENTS

| | | |
|---|---|---|
| JP | 2002-252174 | 9/2002 |
| JP | 2003-224078 | 8/2003 |
| JP | 2004-088052 | 3/2004 |
| JP | 2004-104071 | 4/2004 |
| JP | 2004-140318 | 5/2004 |
| JP | 2004-200204 A | 7/2004 |
| JP | 2005-026354 | 1/2005 |
| JP | 2005-136218 | 5/2005 |
| JP | 2005-167005 | 6/2005 |
| JP | 2008-147533 | 6/2008 |
| JP | 2010-192663 A | 9/2010 |

OTHER PUBLICATIONS

Japanese Office Action mailed Jul. 10, 2012 in connection with corresponding Japanese Patent Application No. 2007-029926 and English translation thereof.

Japanese Office Action mailed Nov. 13, 2012 in connection with corresponding Japanese Patent Application No. 2007-029926 and English translation thereof.

Japanese Office Action mailed Aug. 13, 2013 in connection with corresponding Japanese Patent Application No. 2011-243237 and English translation thereof.

Japanese Office Action mailed Aug. 13, 2013 in connection with corresponding Japanese Patent Application No. 2011-243238 and English translation thereof.

Japanese Office Action mailed Aug. 13, 2013 in connection with corresponding Japanese Patent Application No. 2011-243239 and English translation thereof.

* cited by examiner

F I G . 2
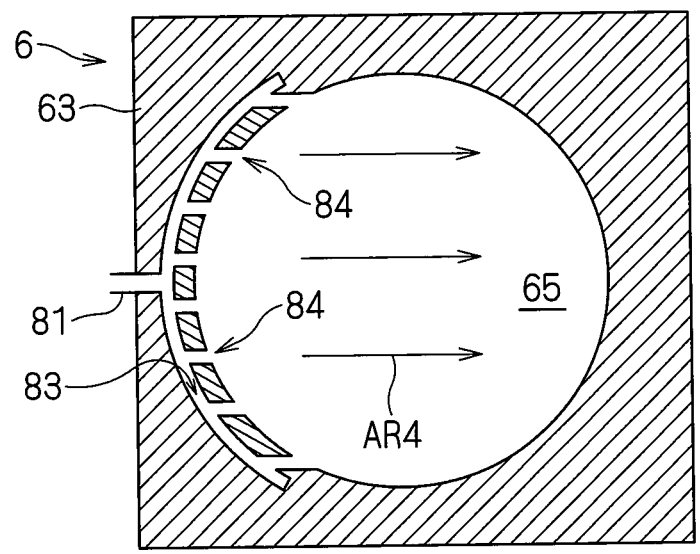

F I G . 4
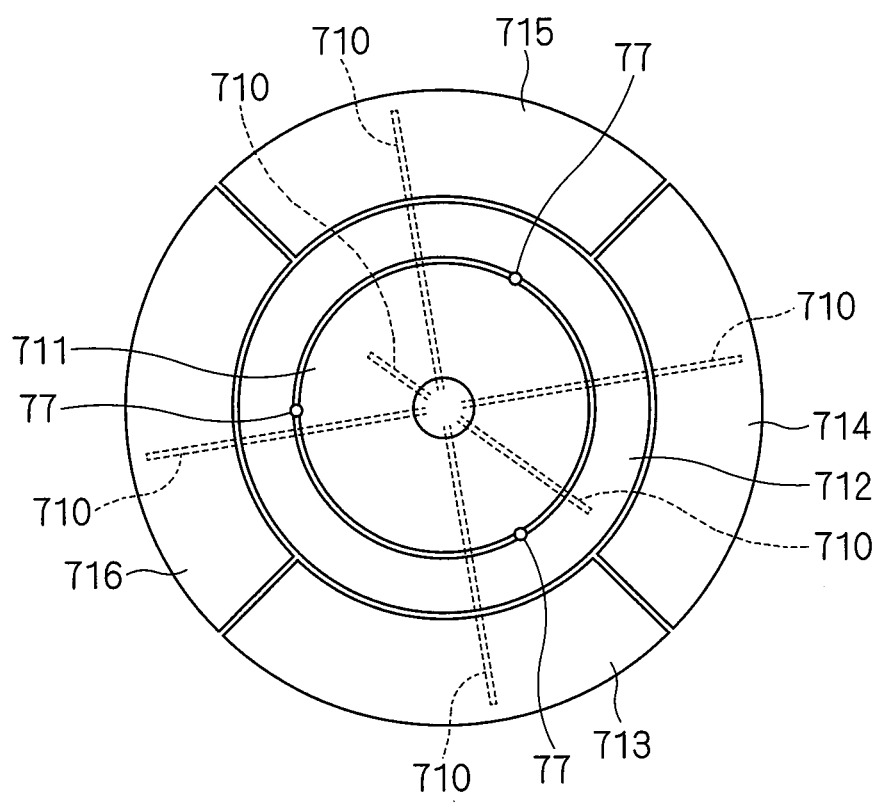

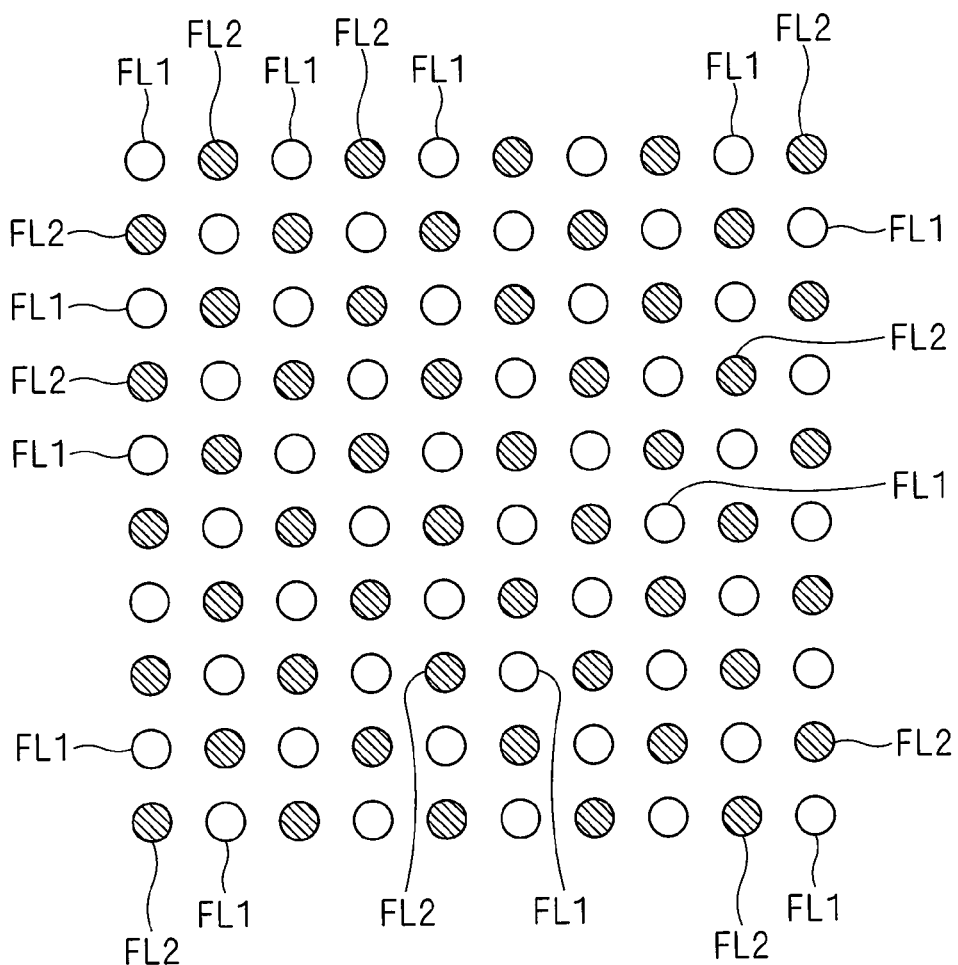
F I G . 1 2

HEAT TREATMENT APPARATUS EMITTING FLASH OF LIGHT

CROSS REFERENCE TO RELATED APPLICATION

This application is a continuation of U.S. application Ser. No. 11/970,002, filed Jan. 7, 2008, by Kenichi YOKOUCHI, entitled HEAT TREATMENT APPARATUS EMITTING FLASH OF LIGHT which claims the benefit of Japanese Appln. S.N. JP2007-029926 filed Feb. 9, 2007, the contents of which are incorporated by this reference.

BACKGROUND OF THE INVENTION

1. Field of the Invention

The present invention relates to a heat treatment apparatus that irradiates a substrate, such as a semiconductor wafer and a glass substrate for a liquid crystal display device, with a flash of light, thereby heating the substrate.

2. Description of the Background Art

Conventionally, lamp annealers employing halogen lamps have been typically used in the step of activating ions in a semiconductor wafer after ion implantation. Such lamp annealers carry out the activation of ions in a semiconductor wafer by heating (or annealing) the semiconductor wafer to a temperature of, for example, about 1000° C. to about 1100° C. . Such heat treatment apparatuses utilize the energy of light emitted from the halogen lamps to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by using the aforementioned lamp annealers which raise the temperature of a semiconductor wafer at a rate of about hundreds of degrees per second produces a phenomenon in which the ions such as boron and phosphorus implanted in the semiconductor wafer are deeply diffused by heat. The occurrence of such a phenomenon causes the depth of the junction to exceed a required level, which can be a hindrance to good device formation.

In view of this, techniques for irradiating the surface of a semiconductor wafer with a flash of light by using xenon flash lamps (hereinafter also referred to simply as "flash lamps") to raise the temperature of only the surface of the ion-implanted semiconductor wafer in an extremely short time (several milliseconds or less) are proposed for example in U.S. Pat. Nos. 6,998,580 and 6,936,797. The flash lamps have a spectral distribution of radiation ranging from ultraviolet to near-infrared regions. The wavelength of light emitted from the flash lamps is shorter than that emitted from conventional halogen lamps, and it approximately coincides with a basic absorption band of a silicon semiconductor wafer. It is therefore possible to, when a semiconductor wafer is irradiated with a flash of light emitted from the flash lamps, rapidly raise the temperature of the semiconductor wafer with a small amount of light transmitted through the semiconductor wafer. It has also turned out that a flash of light emitted in an extremely short time of several milliseconds or less can achieve a selective temperature rise of only near the surface of the semiconductor wafer. Therefore, an extremely short-time temperature rise using the xenon flash lamps allows the execution of only ion activation with no deep ion diffusion.

As described above, the heat treatment apparatuses employing xenon flash lamps are annealers that are essentially suitable for heat treatment of shallow junctions, the need to, using xenon flash lamps, carry out ion activation of somewhat deeper junctions than ever has arisen in recent years. For activation of deeper junctions than ever, conceivable is a technique of increasing the duration of light emission from flash lamps more than ever, thereby to raise the temperature of not only the surface (a shallow portion) but also a deep portion of a semiconductor wafer by heat conduction. As a result, the ion activation of a deep portion of a semiconductor wafer below the surface, i.e., the activation of a deep junction, becomes possible.

However, increasing the duration of light emission from xenon flash lamps so as to raise the temperature of a deep portion increases the surface temperature of the semiconductor wafer more than necessary, thus undesirably resulting in the occurrence of wafer warpage due to the action of great thermal stress on the surface, or at worst, the occurrence of wafer cracking due to an abrupt thermal expansion.

SUMMARY OF THE INVENTION

The invention is intended for a heat treatment apparatus that irradiates a substrate with a flash of light to heat the substrate.

According to the invention, the heat treatment apparatus includes: a holder holding a substrate; a plurality of flash lamps emitting a flash of light toward the substrate held by the holder; a first lamp drive circuit causing the flash lamps to emit light for a duration of a first light-emission time; and a second lamp drive circuit causing the flash lamps to emit light for a duration of a second light-emission time longer than the first light-emission time. The first lamp drive circuit is connected to a first lamp group consisting of part of the plurality of flash lamps, and the second lamp drive circuit is connected to a second lamp group consisting of the remainder of the plurality of flash lamps.

Since irradiation is given with a mixture of a flash of light with a small pulse width and a flash of light with a great pulse width, the activation of a deep junction is possible without causing substrate warpage or cracking.

Preferably, the first lamp group and the second lamp group are so arranged that a flash of light emitted from the first lamp group and a flash of light emitted from the second lamp group are superimposed on one another on a surface of the substrate held by the holder.

This can raise the temperature of even a deep portion of the substrate to an activation temperature or more without heating a shallow portion near the substrate surface more than necessary, thus achieving the activation of a deep junction without causing substrate warpage or cracking.

According to one aspect of the invention, the heat treatment apparatus further includes a light-emission controller controlling the first lamp drive circuit and the second lamp drive circuit so as to stagger start timing of light emission from the flash lamps forming the first lamp group and start timing of light emission from the flash lamps forming the second lamp group.

This produces wide variations of heat treatment patterns.

It is therefore an object of the invention to provide a heat treatment apparatus capable of activating a deep junction without causing substrate warpage or cracking.

These and other objects, features, aspects and advantages of the invention will become more apparent from the following detailed description of the invention when taken in conjunction with the accompanying drawings.

BRIEF DESCRIPTION OF THE DRAWINGS

FIG. 2 is a sectional view showing a gas passage in the heat treatment apparatus of FIG. 1;

FIG. 4 is a plan view of a hot plate;

FIG. 12 is a diagram showing an arrangement of a plurality of flash lamps in a third preferred embodiment;

DESCRIPTION OF THE PREFERRED EMBODIMENTS

Preferred embodiments of the invention are now described in detail with reference to the drawings.

<1. First Preferred Embodiment>

Figure 1:
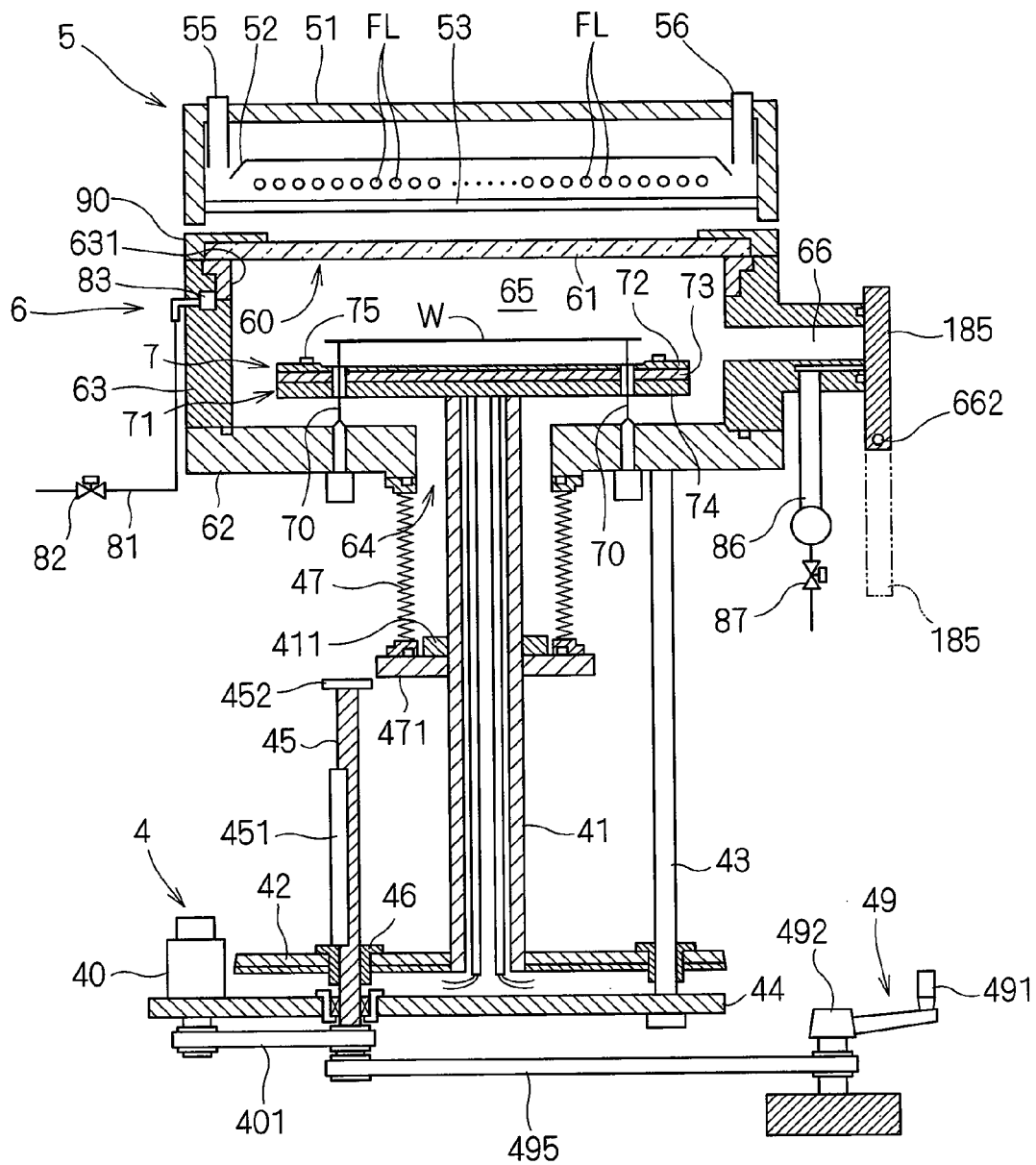
FIG. 1 is a side sectional view showing the construction of a heat treatment apparatus according to the invention.

First, the overall construction of a heat treatment apparatus according to the invention is summarized. FIG. 1 is a side sectional view showing the construction of a heat treatment apparatus 1 according to the invention. The heat treatment apparatus 1 is a flash lamp annealer that irradiates a generally circular semiconductor wafer W serving as a substrate with a flash of light to heat the semiconductor wafer W.

The heat treatment apparatus 1 includes a chamber 6 of a generally cylindrical configuration for receiving a semiconductor wafer W therein, and a lamp house 5 including a plurality of flash lamps FL incorporated therein. The heat treatment apparatus 1 further includes a controller 3 for controlling operating mechanisms provided in the chamber 6 and in the lamp house 5 to cause the operating mechanisms to perform heat treatment of the semiconductor wafer W.

The chamber 6 is provided under the lamp house 5. The chamber 6 includes a chamber side portion 63 having an inner wall of a generally cylindrical configuration, and a chamber bottom portion 62 covering the lower part of the chamber side portion 63. A space surrounded by the chamber side portion 63 and the chamber bottom portion 62 is defined as a heat treatment space 65. A top opening 60 is formed over the heat treatment space 65. The top opening 60 has a chamber window 61 mounted therein to produce a blockage.

The chamber window 61 constituting a ceiling portion of the chamber 6 is a disk-shaped member made of quartz, and transmits a flash of light emitted from the lamp house 5 into the heat treatment space 65. The chamber bottom portion 62 and the chamber side portion 63 which constitute the main body of the chamber 6 are made of, for example, a metal material, such as stainless steel, having high strength and high heat resistance. A ring 631 in the upper part of the inner side surface of the chamber side portion 63 is made of an aluminum (Al) alloy or the like having greater durability against degradation due to exposure to light than stainless steel.

The chamber window 61 and the chamber side portion 63 are sealed with an O-ring so as to maintain the hermeticity of the heat treatment space 65. Specifically, the O-ring is fitted in between a lower peripheral portion of the chamber window 61 and the chamber side portion 63, and a clamp ring 90 is caused to abut against an upper peripheral portion of the chamber window 61 and secured to the chamber side portion 63 by screws, thereby forcing the chamber window 61 against the O-ring.

The chamber bottom portion 62 is provided with a plurality of (in this preferred embodiment, three) upright support pins 70 extending through a holder 7 in order to support the lower surface (a surface opposite from the surface exposed to light from the lamp house 5) of the semiconductor wafer W. The support pins 70 are made of, for example, quartz, and are easy to replace because they are fixed externally of the chamber 6.

The chamber side portion 63 includes a transport opening 66 for transport of the semiconductor wafer W into and out of the chamber 6. The transport opening 66 is openable and closable by a gate valve 185 that pivots about an axis 662. On the opposite side of the chamber side portion 63 from the transport opening 66, an inlet passage 81 is formed, which introduces a processing gas (for example, an inert gas such as nitrogen ($N_2$) gas, helium (He) gas, and argon (Ar) gas, or oxygen ($O_2$) gas, or the like) into the heat treatment space 65. The inlet passage 81 has its one end connected through a valve 82 to a gas supply mechanism not shown, and the other end connected to a gas inlet buffer 83 formed inside the chamber side portion 63. The transport opening 66 is provided with an outlet passage 86 for exhausting gas inside the heat treatment space 65. The outlet passage 86 is connected through a valve 87 to an exhaust mechanism not shown.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side from the transport opening 66 shown in FIG. 1. Processing gas introduced through the inlet passage 81 to the gas inlet buffer 83 is fed through a plurality of gas supply holes 84 into the heat treatment space 65.

The heat treatment apparatus 1 further includes the holder 7 of a generally disk-shaped configuration for holding a semiconductor wafer W in a horizontal position within the chamber 6 and preheating the holding semiconductor wafer W prior to exposure of a flash of light, and a holder elevating mechanism 4 for moving the holder 7 upwardly and downwardly relative to the chamber bottom portion 62 serving as the bottom surface of the chamber 6. The holder elevating mechanism 4 shown in FIG. 1 includes a shaft 41 of a generally cylindrical configuration, a movable plate 42, guide members 43 (in this preferred embodiment, three guide members 43 provided around the shaft 41), a fixed plate 44, a ball screw 45, a nut 46, and a motor 40. The chamber bottom portion 62 serving as the bottom of the chamber 6 is provided with a bottom opening 64 of a generally circular configuration having a diameter smaller than that of the holder 7. The shaft 41 made of stainless steel is inserted through the bottom opening 64 and connected to the lower surface of the holder 7 (strictly speaking, a hot plate 71 of the holder 7) to support the holder 7.

The nut 46 for threaded engagement with the ball screw 45 is fixed to the movable plate 42. The movable plate 42 is slidably guided by the guide members 43 fixed to and extending downwardly from the chamber bottom portion 62, so as to be vertically movable. The movable plate 42 is coupled through the shaft 41 to the holder 7.

The motor 40 is installed on the fixed plate 44 mounted to the lower end portions of the guide members 43, and is connected to the ball screw 45 through a timing belt 401. When the holder elevating mechanism 4 moves the holder 7 upwardly and downwardly, the motor 40 serving as a driver rotates the ball screw 45 under the control of the controller 3 so that the movable plate 42 fixed to the nut 46 moves vertically along the guide members 43. As a result, the shaft 41 fixed to the movable plate 42 moves vertically, whereby the holder 7 connected to the shaft 41 smoothly moves upwardly and downwardly between a position for transfer of the semiconductor wafer W (hereinafter referred to as a "transfer position") shown in FIG. 1 and a position for treatment of the semiconductor wafer W (hereinafter referred to as a "treatment position") shown in FIG. 5.

A mechanical stopper 451 of a generally semi-cylindrical configuration (a configuration obtained by cutting a cylinder in half in a longitudinal direction) is provided upright and extending along the ball screw 45 on the upper surface of the movable plate 42. Even if the movable plate 42 moves upwardly beyond a certain upper limit due to any anomaly, the upper end of the mechanical stopper 451 strikes an end plate 452 provided at the end of the ball screw 45, which thereby prevents an abnormal upward movement of the movable plate 42. This avoids an upward movement of the holder 7 above a certain position under the chamber window 61, thereby preventing a collision between the holder 7 and the chamber window 61.

The holder elevating mechanism 4 further includes a manual elevator 49 for manually moving the holder 7 upwardly and downwardly during maintenance of the interior of the chamber 6. The manual elevator 49 includes a handle 491 and a rotary shaft 492. Rotating the rotary shaft 492 by means of the handle 491 causes the rotation of the ball screw 45 connected through a timing belt 495 to the rotary shaft 492, thereby moving the holder 7 upwardly and downwardly.

An expandable/contractible bellows 47 that surrounds the shaft 41 and extends downwardly from the chamber bottom portion 62 is provided under the chamber bottom portion 62, with its upper end connected to the lower surface of the chamber bottom portion 62. The lower end of the bellows 47 is mounted to a bellows-lower-end plate 471. The bellows-lower-end plate 471 is mounted to the shaft 41 with screws by a collar member 411. The bellows 47 contracts when the holder elevating mechanism 4 moves the holder 7 upwardly relative to the chamber bottom portion 62, while it expands when the holder elevating mechanism 4 moves the holder 7 downwardly. The expansion and contraction of the bellows 47 maintains the hermeticity of the interior of the heat treatment space 65 even during the upward and downward movements of the holder 7.

Figure 3:
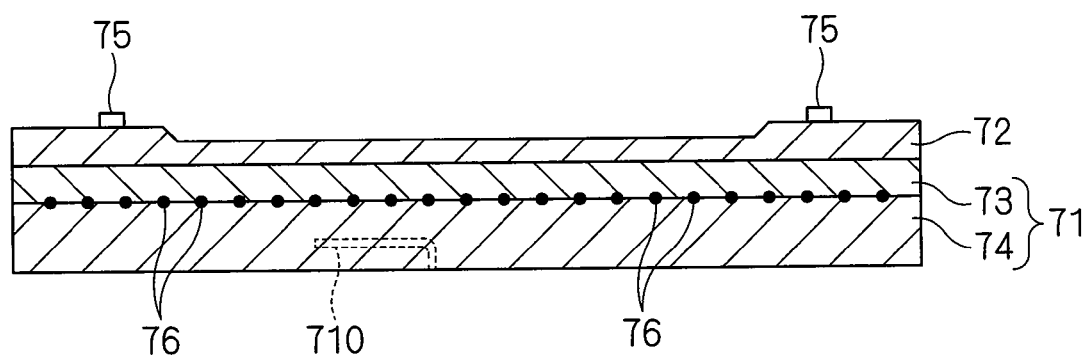
FIG. 3 is a cross-sectional view showing the structure of a holder.

FIG. 3 is a sectional view showing the structure of the holder 7. The holder 7 includes the hot plate (or heating plate) 71 for preheating (or assist-heating) the semiconductor wafer W, and a susceptor 72 installed on the upper surface of the hot plate 71 (the surface on the side where the holder 7 holds the semiconductor wafer W). The shaft 41 that moves the holder 7 upwardly and downwardly as mentioned above is connected to the lower surface of the holder 7. The susceptor 72 is made of quartz (or it may be made of aluminum nitride (AlN) or the like) and has on the upper surface pins 75 for preventing misalignment of the semiconductor wafer W. The susceptor 72 is installed on the hot plate 71, with its lower surface in face-to-face contact with the upper surface of the hot plate 71. Thus, the susceptor 72 diffuses and transmits heat energy from the hot plate 71 into the semiconductor wafer W placed on the upper surface of the susceptor 72, and during maintenance, it is removable from the hot plate 71 for cleaning.

The hot plate 71 includes an upper plate 73 and a lower plate 74 both made of stainless steel. In a space between the upper plate 73 and the lower plate 74, resistance heating wires 76 such as nichrome wires for heating the hot plate 71 are provided, and the space is filled and sealed with an electrically conductive brazing metal containing nickel (Ni). The upper plate 73 and the lower plate 74 have their ends brazed or soldered.

FIG. 4 is a plan view of the hot plate 71. As shown in FIG. 4, the hot plate 71 has a disk-shaped zone 711 and a ring-shaped zone 712 concentrically arranged in a central part of the area facing the held semiconductor wafer W, and four zones 713 to 716 which are equally and circumferentially divided portions of a generally ring-shaped area surrounding the zone 712. There is a slight gap between each of the zones. The hot plate 71 is further provided with three through holes 77 receiving the support pins 70 therethrough and circumferentially spaced 120° apart from each other in a gap between the zones 711 and 712.

In each of the six zones 711 to 716, the resistance heating wires 76 independent of each other are placed so as to make a circuit, thereby forming an individual heater. The heaters incorporated in the zones individually heats the zones. The semiconductor wafer W held by the holder 7 is heated by the heaters incorporated in the six zones 711 to 716. In each of the zones 711 to 716, a sensor 710 is also provided to measure the temperature of each zone using a thermocouple. The sensors 710 are connected to the controller 3 through the interior of the generally cylindrical shaft 41.

In heating the hot plate 71, the controller 3 controls the amount of power supply to the resistance heating wires 76 in each zone so that the temperatures of the six zones 711 to 716 measured by the sensors 710 reach a certain preset temperature. The temperature control in each zone by the controller 3 is done by PID (Proportional, Integral, Derivative) control. In the hot plate 71, the temperatures of the zones 711 to 716 are continually measured until the completion of the heat treatment of the semiconductor wafer W (or the completion of the heat treatment of all semiconductor wafers W when there are a plurality of semiconductor wafers W to be successively heat treated), and the amount of power supply to the resistance heating wires 76 in each zone is individually controlled, that is, the temperature of the heater in each zone is individually controlled, so that the temperature of each zone is maintained at a preset temperature. The preset temperature of each zone can be changed by an individually determined offset value from a reference temperature.

The resistance heating wires 76 in each of the six zones 711 to 716 are connected through power lines passing through the interior of the shaft 41 to a power source (not shown). The power lines extending from the power source to each zones are disposed inside a stainless tube filled with an insulator of magnesia (magnesium oxide) or the like so as to be electrically insulated from each other. The interior of the shaft 41 is open to the atmosphere.

Next, the lamp house 5 includes a light source including a plurality of (in this preferred embodiment, 30) xenon flash lamps (hereinafter referred to simply as "flash lamps") FL, and a reflector 52 provided to cover over the light source. A lamp light irradiation window 53 is mounted in a bottom portion of an enclosure 51 of the lamp house 5. The lamp light irradiation window 53 constituting a floor portion of the lamp house 5 is a plate-like member made of quartz. The provision of the lamp house 5 over the chamber 6 places the lamp light irradiation window 53 in opposed relation to the chamber window 61. The lamp house 5 heats the semiconductor wafer W by irradiating the semiconductor wafer W held by the holder 7 within the chamber 6 with a flash of light from the flash lamps FL through the lamp light irradiation window 53 and the chamber window 61.

The plurality of flash lamps FL are rod-like lamps having an elongated cylindrical configuration. In the first preferred embodiment, the flash lamps FL are arranged in an array in a plane so that their respective longitudinal directions are in parallel with each other along a major surface of the semiconductor wafer W held by the holder 7 (i.e., along a horizontal direction). Accordingly, the plane defined by the array of the flash lamps FL is a horizontal plane.

Figure 6:
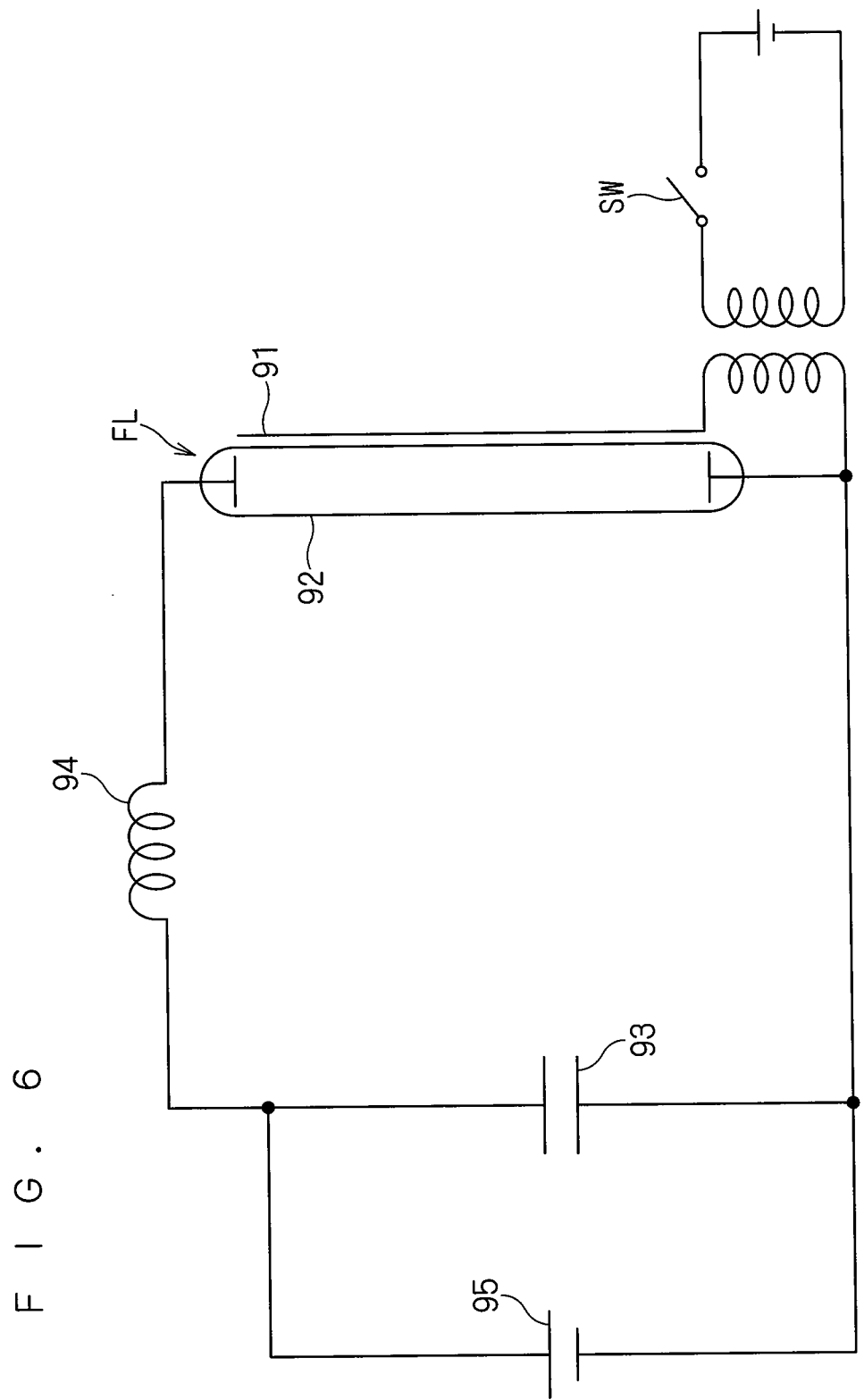
FIG. 6 is a diagram showing a drive circuit for a xenon flash lamp.

FIG. 6 is a diagram showing a drive circuit for xenon flash lamp FL. The xenon flash lamps FL each include a rod-like glass tube (or discharge tube) 92 containing xenon gas sealed therein and having at opposite ends positive and negative electrodes connected to a capacitor 93, and a trigger electrode 91 affixed to the outer peripheral surface of the glass tube 92. The capacitor 93 receives a given voltage applied from a power supply unit 95 and accumulates charge induced by the applied voltage. A circuit for connecting the capacitor 93 and the electrodes of the glass tube 92 is provided with a coil 94.

Since xenon gas is electrically insulative, no current flows in the glass tube 92 in a normal state even in the presence of accumulated charge on the capacitor 93. However, if a trigger switch SW is turned on and a high voltage is applied to the trigger electrode 91, to cause an electrical breakdown, accumulated electricity on the capacitor 93 flows momentarily in the glass tube 92, and the resultant Joule heat heats the xenon gas to cause light emission. That is, the start timing of light emission from the xenon flash lamps FL is determined by the timing of switching of the trigger switch SW from OFF to ON. Such xenon flash lamps FL have the property of being capable of emitting much more intense light than a light source that stays lit continuously because electrostatic energy previously accumulated on the capacitor 93 is converted into an ultrashort light pulse ranging from 0.1 millisecond to 10 milliseconds. The trigger switch SW may, for example, be an electrical switching element such as a thyristor.

Now, in the first preferred embodiment, 30 flash lamps FL are provided, each accompanied by one drive circuit as shown in FIG. 6. The duration of light emission from the xenon flash lamps FL is determined by the capacitance of the capacitor 93 and the inductance of the coil 94. It is known that the pulse period of a flash of light emitted from the flash lamps FL, i.e., the duration of light emission from the flash lamps FL for each irradiation of a flash of light, is proportional to half of the square of the product of the capacitance of the capacitor 93 and the inductance of the coil 94. Thus, the duration of light emission from the flash lamp FL becomes longer as the capacitance of the capacitor 93 or the inductance of the coil 94 increases.

Figure 7:
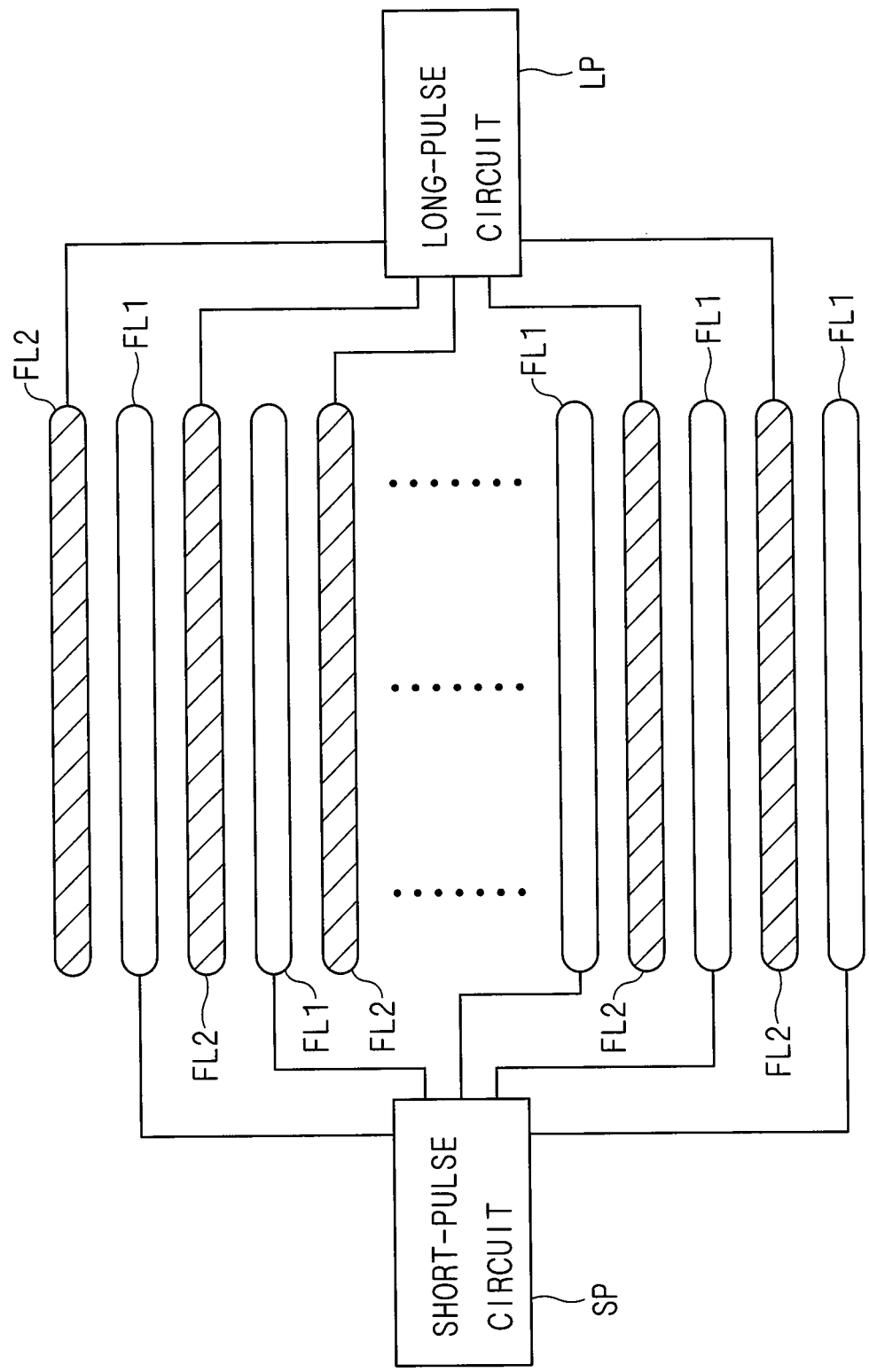
FIG. 7 illustrates an arrangement of a plurality of flash lamps in a first preferred embodiment.

The first preferred embodiment employs two types of lamp drive circuits each having a different inductance of the coil 94. The thirty flash lamps FL each are connected to either of the two types of drive circuits. FIG. 7 shows the arrangement of a plurality of flash lamps FL in the first preferred embodiment. As shown in FIG. 7, the thirty flash lamps FL each are connected to either a short-pulse circuit SP or a long-pulse circuit LP. The short-pulse circuit SP is a drive circuit including the capacitor 93 with capacitance of 750 μF and the coil 94 with inductance of 260 μH in the configuration of FIG. 6. The long-pulse circuit LP is a drive circuit including the capacitor 93 with capacitance of 750 μF and the coil 94 with inductance of 2200 μH in the configuration of FIG. 6. The duration of light emission from flash lamps FL1 connected to the short-pulse circuit SP is approximately 0.1 milliseconds, while the duration of light emission from flash lamps FL2 (indicated by hatched lines in FIG. 7 for easier understanding) connected to the long-pulse circuit LP is approximately 3.0 milliseconds. That is, the long-pulse circuit LP includes the coil 94 with larger inductance than the coil 94 in the short-pulse circuit SP, so that the duration of light emission from the flash lamps FL2 connected to the long-pulse circuit LP is longer than the duration of light emission from the flash lamps FL1 connected to the short-pulse circuit SP.

In the first preferred embodiment, as shown in FIG. 7, the flash lamps FL1 and the flash lamps FL2 are alternately arranged in a line. More specifically, the thirty flash lamps FL (generically referred to as "flash lamps FL" when it is not necessary to distinguish between the flash lamps FL1 and the flash lamps FL2) are divided into two lamp groups each consisting of fifteen flash lamps FL. One of the lamp groups (a first lamp group) is connected to the short-pulse circuit SP, and the other of the lamp groups (a second lamp group) is connected to the long-pulse circuit LP. Then, the flash lamps FL1 forming the first lamp group and the flash lamps FL2 forming the second lamp group are arranged alternately. Although in FIG. 7, for convenience in drawing, the fifteen flash lamps FL1 are connected to one short-pulse circuit SP, and the fifteen flash lamps FL2 are connected to one long-pulse circuit LP, it is to be noted that, as described above, one flash lamp FL corresponds to one drive circuit so that each of the short-pulse circuit SP and the long-pulse circuit LP in FIG. 7 comprehensively represents fifteen drive circuits.

The reflector 52 is provided to cover over the whole of the plurality of flash lamps FL. The fundamental function of the reflector 52 is to reflect a flash of light emitted from the plurality of flash lamps FL toward the holder 7. The reflector 52 is a plate made of an aluminum (Al) alloy and has a surface (the surface facing the flash lamps FL) roughened by abrasive blasting to produce a satin finish thereon. The reason for such roughening is that the reflector 52 having a perfect mirror surface causes a regular pattern in the intensity of reflected light from the plurality of flash lamps FL, thereby deteriorating the uniformity of a surface temperature distribution across the semiconductor wafer W.

Figure 8:
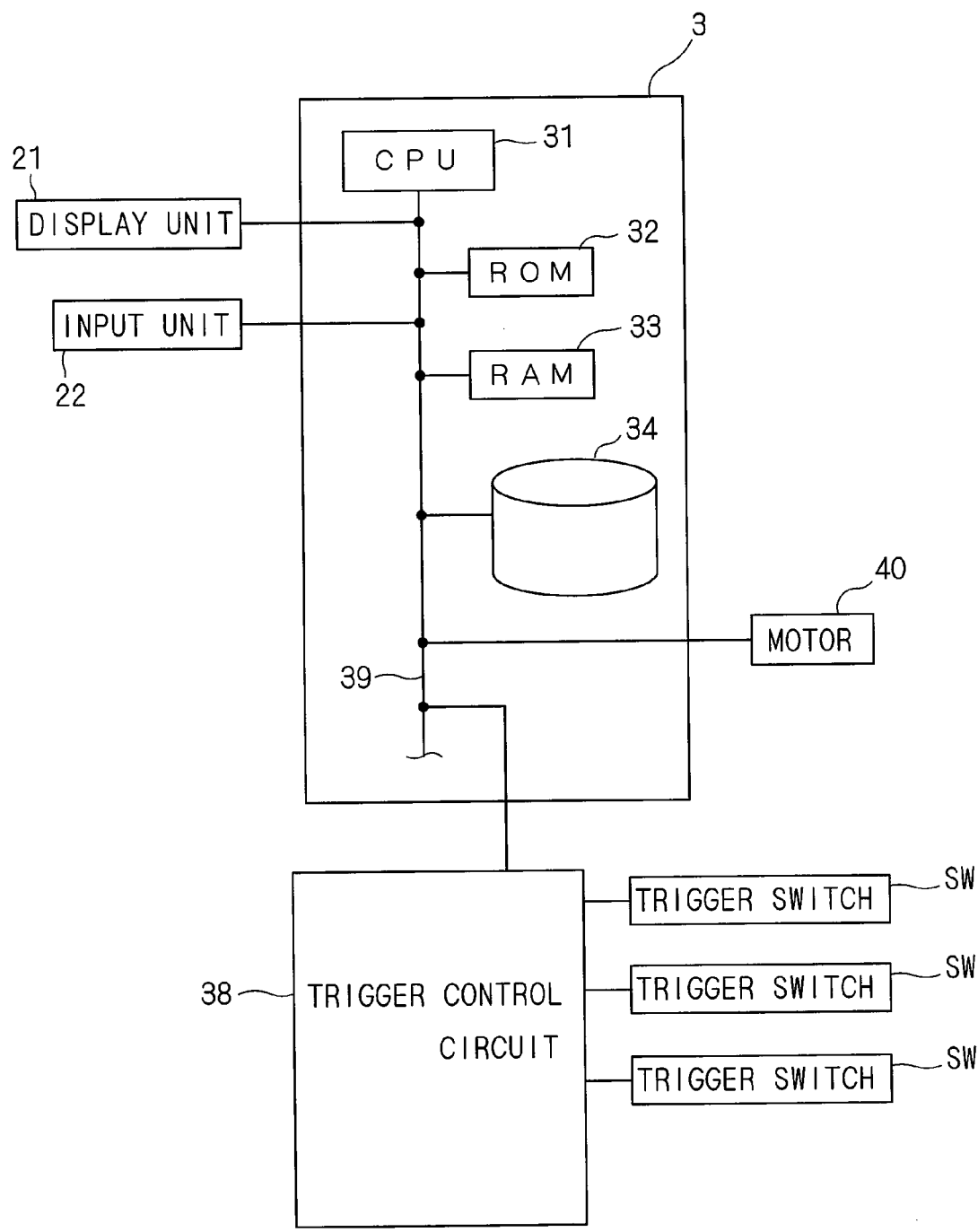
FIG. 8 is a block diagram showing the structure of a controller.

The controller 3 controls the aforementioned various operating mechanisms installed in the heat treatment apparatus 1. FIG. 8 is a block diagram showing the structure of the controller 3. The controller 3 is similar in hardware construction to a typical computer. Specifically, the controller 3 includes a CPU 31 performing various computation processes, a ROM 32 serving as read-only memory for storing a basic program therein, a RAM 33 serving as readable/writable memory for storing various pieces of information therein, and a magnetic disk 34 for storing control software and data therein, all of which are connected to a bus line 39.

The bus line 39 is electrically connected to the motor 40 in the holder elevating mechanism 4 for moving the holder 7 upwardly and downwardly in the chamber 6, and to a trigger control circuit 38. The trigger control circuit 38 is connected to the trigger switches SW of the plurality of flash lamps FL and controls the turning on and off of the trigger switches SW. The CPU 31 in the controller 3, by execution of control software stored in the magnetic disk 34, controls the motor 40 to adjust the level of the holder 7, and controls the trigger control circuit 38 so that the plurality of flash lamps FL emit light with given timing, i.e., the trigger switches SW are turned on with given timing.

The bus line 39 is further electrically connected to a display unit 21 and an input unit 22. The display unit 21 is configured as, for example, a liquid crystal display or the like, and displays various kinds of information such as the result of processing and recipe content. The input unit 22 is configured as, for example, a keyboard, a mouse, or the like, and receives input of commands, parameters, and the like. An operator using the apparatus can input commands, parameters, and the like using the input unit 22 while confirming the contents displayed on the display unit 21. Alternatively, the display unit 21 and the input unit 22 may be configured integrally as a touch panel.

In addition to the aforementioned components, the heat treatment apparatus 1 includes various cooling structures in order to prevent an excessive temperature rise in the chamber 6 and in the lamp house 5 due to heat energy generated from the flash lamps FL and the hot plate 71 during the heat treatment of the semiconductor wafer W. For example, the chamber side portion 63 and the chamber bottom portion 62 of the chamber 6 are provided with a water cooling tube (not shown). The lamp house 5 has an air-cooling structure including a gas supply pipe 55 and an exhaust gas pipe 56 for forming a gas flow inside the lamp house 5 to exhaust heat (see FIG. 1). Air is also supplied into a gap between the chamber window 61 and the lamp light irradiation window 53, thereby cooling the lamp house 5 and the chamber window 61.

Next, a procedure for the treatment of the semiconductor wafer W in the heat treatment apparatus 1 is briefly described. The semiconductor wafer W to be treated herein is a semiconductor substrate doped with impurities (ions) by an ion implantation process. The activation of the implanted impurities is achieved by a flash heating process in the heat treatment apparatus 1.

Figure 5:
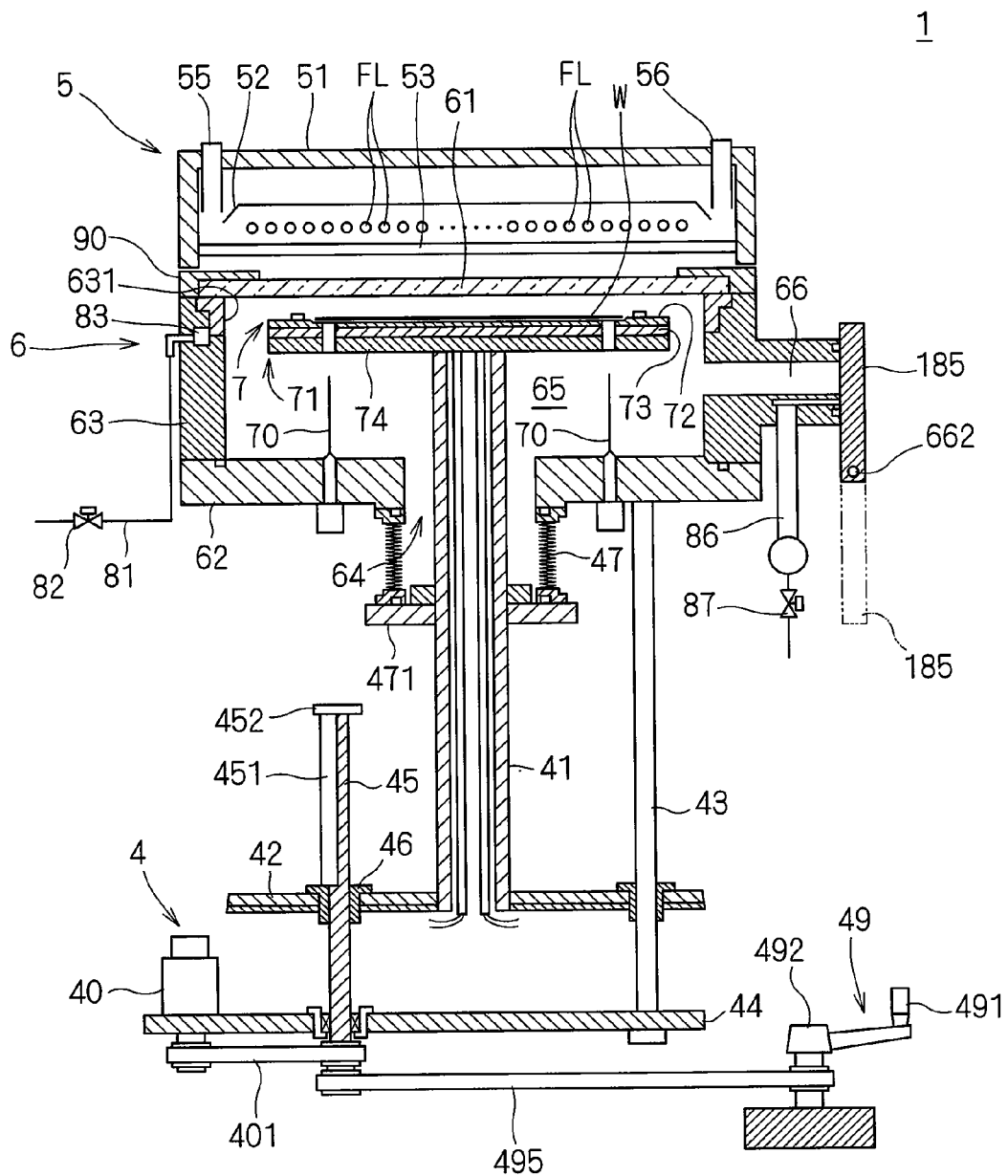
FIG. 5 is a side sectional view showing the construction of the heat treatment apparatus of FIG. 1.

First, the holder 7 is moved downwardly from the treatment position shown in FIG. 5 to the transfer position shown in FIG. 1. The "treatment position" is the position of the holder 7 when the semiconductor wafer W is exposed to a flash of light emitted from the flash lamps FL, and specifically, the position of the holder 7 within the chamber 6 shown in FIG. 5. The "transfer position" is the position of the holder 7 when the semiconductor wafer W is transported into and out of the chamber 6, and specifically, the position of the holder 7 within the chamber 6 shown in FIG. 1. A reference position of the holder 7 in the heat treatment apparatus 1 is the treatment position, and prior to the treatment, the holder 7 is in the treatment position. At the start of the treatment, the holder 7 is moved downwardly to the transfer position. As shown in FIG. 1, the holder 7 after moved downwardly to the transfer position is in close proximity to the chamber bottom portion 62, and the upper ends of the support pins 70 protrude through the holder 7 upwardly above the holder 7.

When the holder 7 is moved downwardly to the transfer position, the valves 82 and 87 are opened to introduce nitrogen gas at room temperature into the heat treatment space 65 of the chamber 6. Subsequently, the gate valve 185 is opened to open the transport opening 66, and the ion-implanted semiconductor wafer W is transported through the transport opening 66 into the chamber 6 and placed onto the plurality of support pins 70 by a transport robot outside the heat treatment apparatus 1.

The amount of nitrogen gas purged into the chamber 6 during the transport of the semiconductor wafer W shall be about 40 liters per minute. The supplied nitrogen gas flows in the chamber 6 from the gas inlet buffer 83 in the direction indicated by the arrows AR4 of FIG. 2, and is exhausted through the outlet passage 86 and the valve 87 shown in FIG. 1 by a utility exhaust system. Part of the nitrogen gas supplied into the chamber 6 is exhausted also from a discharge outlet (not shown) inside the bellows 47. In the following steps described below, nitrogen gas is always continuously supplied into and exhausted from the chamber 6, and the amount of supply of nitrogen gas is varied in accordance with the process steps of the semiconductor wafer W.

After the semiconductor wafer W is transported into the chamber 6, the gate valve 185 closes the transport opening 66. Then, the holder elevating mechanism 4 moves the holder 7 upwardly from the transfer position to the treatment position close to the chamber window 61. In the course of the upward movement of the holder 7 from the transfer position, the semiconductor wafer W is transferred from the support pins 70 to the susceptor 72 of the holder 7 and is placed and held on the upper surface of the susceptor 72. With the upward movement of the holder 7 to the treatment position, the semiconductor wafer W on the susceptor 72 is also held in the treatment position.

The six zones 711 to 716 of the hot plate 71 have already been heated up to a certain temperature by the heaters (the resistance heating wires 76) individually provided within the zones (between the upper plate 73 and the lower plate 74). By the holder 7 moving upwardly to the treatment position to bring the semiconductor wafer W into contact with the holder 7, the semiconductor wafer W is preheated by the heaters in the hot plate 71 and gradually increases in temperature.

Preheating the semiconductor wafer W in the treatment position for about 60 seconds increases the temperature of the semiconductor wafer W up to a preset preheating temperature T1. The preheating temperature T1 shall be in the range of approximately 200° C. to approximately 800° C., preferably approximately 350° C. to approximately 550° C., at which there is no apprehension that impurities implanted in the semiconductor wafer W are diffused by heat. A distance between the holder 7 and the chamber window 61 is adjustable to any value by controlling the amount of rotation of the motor 40 of the holder elevating mechanism 4.

After a lapse of the preheating time of about 60 seconds, with the holder 7 remaining in the treatment position, a flash of light is emitted from the flash lamps FL in the lamp house 5 toward the semiconductor wafer W under the control of the controller 3. More specifically, the controller 3 controls the trigger control circuit 38 to turn on the trigger switches SW in the short-pulse circuit SP and in the long-pulse circuit LP connected to all of the flash lamps FL simultaneously and in unison. At this time, part of the flash of light emitted from the flash lamps FL travels directly toward the holder 7 within the chamber 6, and another part of the light is once reflected by the reflector 52 and then travels toward the interior of the chamber 6. Such emission of the flash of light achieves the flash heating of the semiconductor wafer W. Since the flash heating is done by the emission of a flash of light from the flash lamps FL, the surface temperature of the semiconductor wafer W can be raised in a short time.

Figure 9:
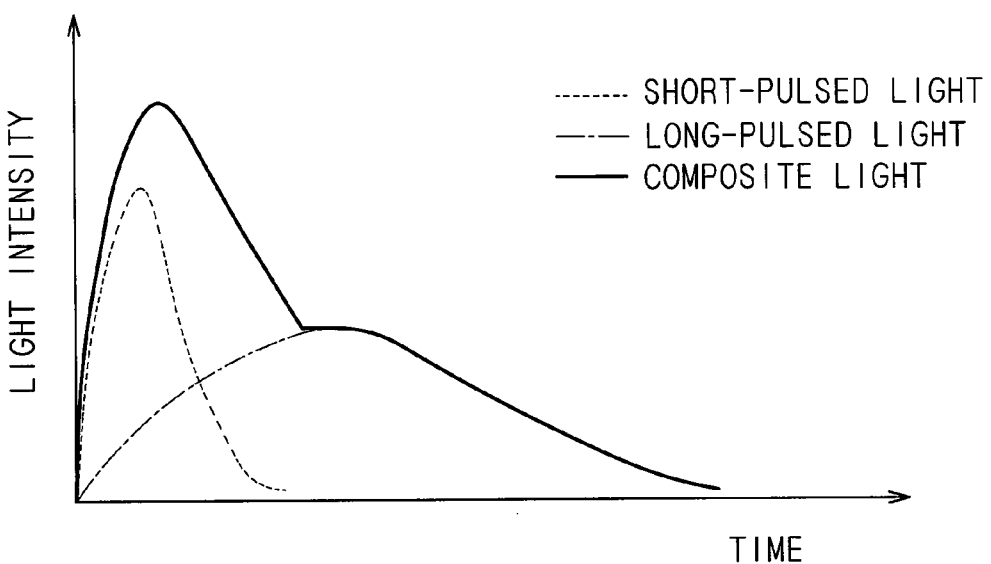
FIG. 9 shows the transition of the light intensity in the surface of a semiconductor wafer.

In the first preferred embodiment, the flash lamps FL1 that emit light for a relatively short time and the flash lamps FL2 that emit light for a relatively long time are alternately arranged in a line (FIG. 7). In other words, the flash lamps FL1 and FL2 with different pulse widths (pulse periods of the flash of light) are arranged next to one another. Thus, the flash of light emitted from the flash lamps FL1 and the flash of light emitted from the flash lamps FL2 are uniformly superimposed on one another on the whole area of the surface of the semiconductor wafer W held by the holder 7 in the treatment position. Consequently, the light intensity in the surface of the semiconductor wafer W since the start of light emission (since when the trigger switches SW are turned on) transitions as shown in FIG. 9. Referring to FIG. 9, the dotted line indicates the intensity of the flash of light emitted from the flash lamps FL1 with short pulse widths; the long and short dashed lines indicate the intensity of the flash of light emitted from the flash lamps FL2 with long pulse widths; and the solid line indicates the light intensity obtained by superimposing both the light intensities.

The flash of light emitted from the flash lamps FL1 with short pulse widths has a high peak intensity, but its intensity diminishes in a short time. On the contrary, the flash of light emitted from the flash lamps FL2 with long pulse widths has a lower peak intensity than that emitted from the flash lamps FL1, but its light intensity is maintained for a relatively long time. As a result of superimposing those flashes of light emitted from the flash lamps FL1 and FL2 on one another, as shown in FIG. 9, a high peak intensity is obtained immediately after the start of light emission because the emission of the flash of light from the flash lamps FL1 becomes dominant. After the intensity of the flash of light from the flash lamps FL1 diminishes, a certain level of light intensity is maintained for a relatively long time because the emission of flashes of light from the flash lamps FL2 becomes dominant.

Figure 10:
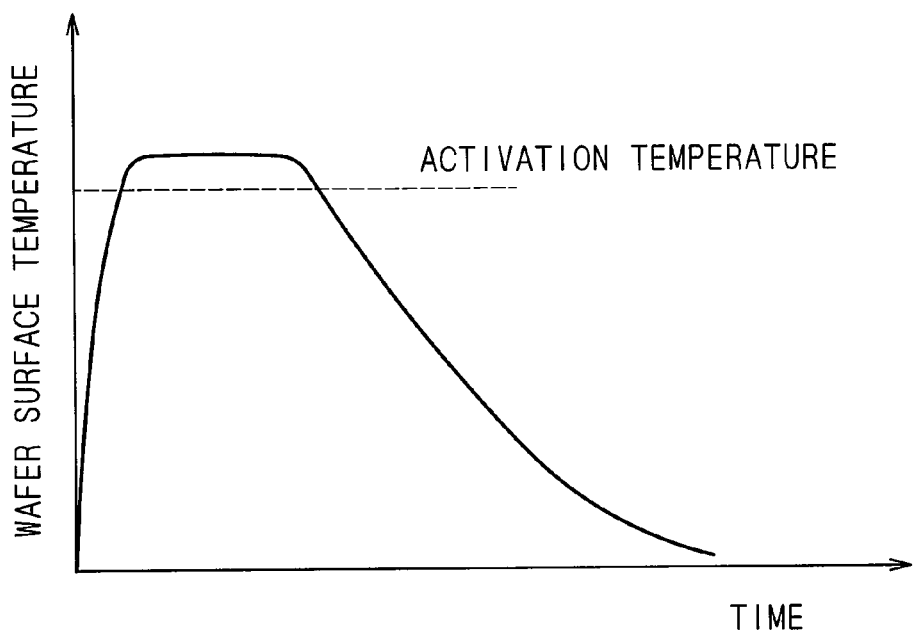
FIG. 10 shows the transition of the surface temperature of a semiconductor wafer since the start of light emission.

FIG. 10 shows the transition of the surface temperature of the semiconductor wafer W since the start of light emission. Immediately after the start of light emission, the surface temperature of the semiconductor wafer W rapidly rises to a treatment temperature T2 which is not less than an activation temperature of ions (in the range of approximately 1000° C. to 1100° C.) mainly by the flash of light with a high peak intensity emitted from the flash lamps FL1 with short pulse widths. The surface temperature then gradually drops after maintained at the activation temperature or more for a relatively long time by keeping warm effectiveness produced mainly by the flash of light with a gentle peak emitted from the flash lamps FL2 with long pulse widths. This consequently increases the temperature of even a relatively deep portion of the semiconductor wafer W below the surface to the activation temperature or more, thereby achieving the activation of a deep junction. On the other hand, the temperature of the surface (a shallow portion) of the semiconductor wafer W does not rise more than necessary, which thereby prevents warpage or cracking of the semiconductor wafer W.

In this way, not only a shallow junction but also a relatively deep junction of the semiconductor wafer W can be activated. Note that, although the duration of light emission from the flash lamps FL2 is relatively long, approximately 3.0 milliseconds, this time is quite short as compared with the time necessary for thermal diffusion of implanted impurities so that impurity diffusion does not occur even in the surface (shallow portion) of the semiconductor wafer W.

By preheating the semiconductor wafer W by the holder 7 prior to flash heating, the emission of the flash of light from the flash lamps FL can rapidly increase the surface temperature of the semiconductor wafer W up to the treatment temperature T2.

After waiting in the treatment position for about 10 seconds after the completion of the flash heating, the holder 7 is moved downwardly again to the transfer position shown in FIG. 1 by the holder elevating mechanism 4, and the semiconductor wafer W is transferred from the holder 7 to the support pins 70. Subsequently, the gate valve 185 opens the transport opening 66 having been closed, and the semiconductor wafer W placed on the support pins 70 is transported outwardly by the transport robot outside the heat treatment apparatus 1. This completes the flash heating process of the semiconductor wafer W in the heat treatment apparatus 1.

During the heat treatment of the semiconductor wafer W in the heat treatment apparatus 1, as discussed above, nitrogen gas is continuously supplied into the chamber 6. The amount of supply of nitrogen gas shall be approximately 30 liters per minute when the holder 7 is in the treatment position and it shall be approximately 40 liters per minute when the holder 7 is in any position other than the treatment position.

As so far described, in the first preferred embodiment, the flash lamps FL1 with short pulse widths and the flash lamps FL2 with long pulse widths are alternately arranged in a line (FIG. 7). When the thirty flash lamps FL have a constant pulse width as in the past, an attempt to increase the temperature of even a deep portion of the semiconductor wafer W below the surface to the activation temperature or more causes the temperature of a shallow portion to be excessively increased more than necessary, thereby causing wafer warpage or cracking due to thermal stress as previously discussed. On the contrary, when the temperature of a shallow portion near the surface of the semiconductor wafer W is increased to an optimum temperature, a deep portion of the semiconductor wafer W does not reach the activation temperature, so that the activation of a deep junction is difficult.

By alternately arranging the flash lamps FL1 with short pulse widths and the flash lamps FL2 with long pulse widths as in the present preferred embodiment, the flash of light with a high peak intensity from the flash lamps FL1 and the flash of light with a gentle peak from the flash lamps FL2 can be uniformly superimposed on one another on the whole surface of the semiconductor wafer W. Thus, the temperature of even a deep portion of the semiconductor wafer W can be increased to the activation temperature or more without heating a shallow portion near the surface of the semiconductor wafer W more than necessary. This achieves the activation of a deep junction without causing warpage or cracking of the semiconductor wafer W.

<2. Second Preferred Embodiment>

Next, a second preferred embodiment of the invention is described. The overall construction of a heat treatment apparatus of the second preferred embodiment is generally the same as that of the first preferred embodiment shown in FIGS. 1 and 5. The procedure for the treatment of the semiconductor wafer W in the heat treatment apparatus of the second preferred embodiment is also the same as that described in the first preferred embodiment. The heat treatment apparatus of the second preferred embodiment differs from that of the first preferred embodiment in the arrangement of the flash lamps FL.

Figure 11:
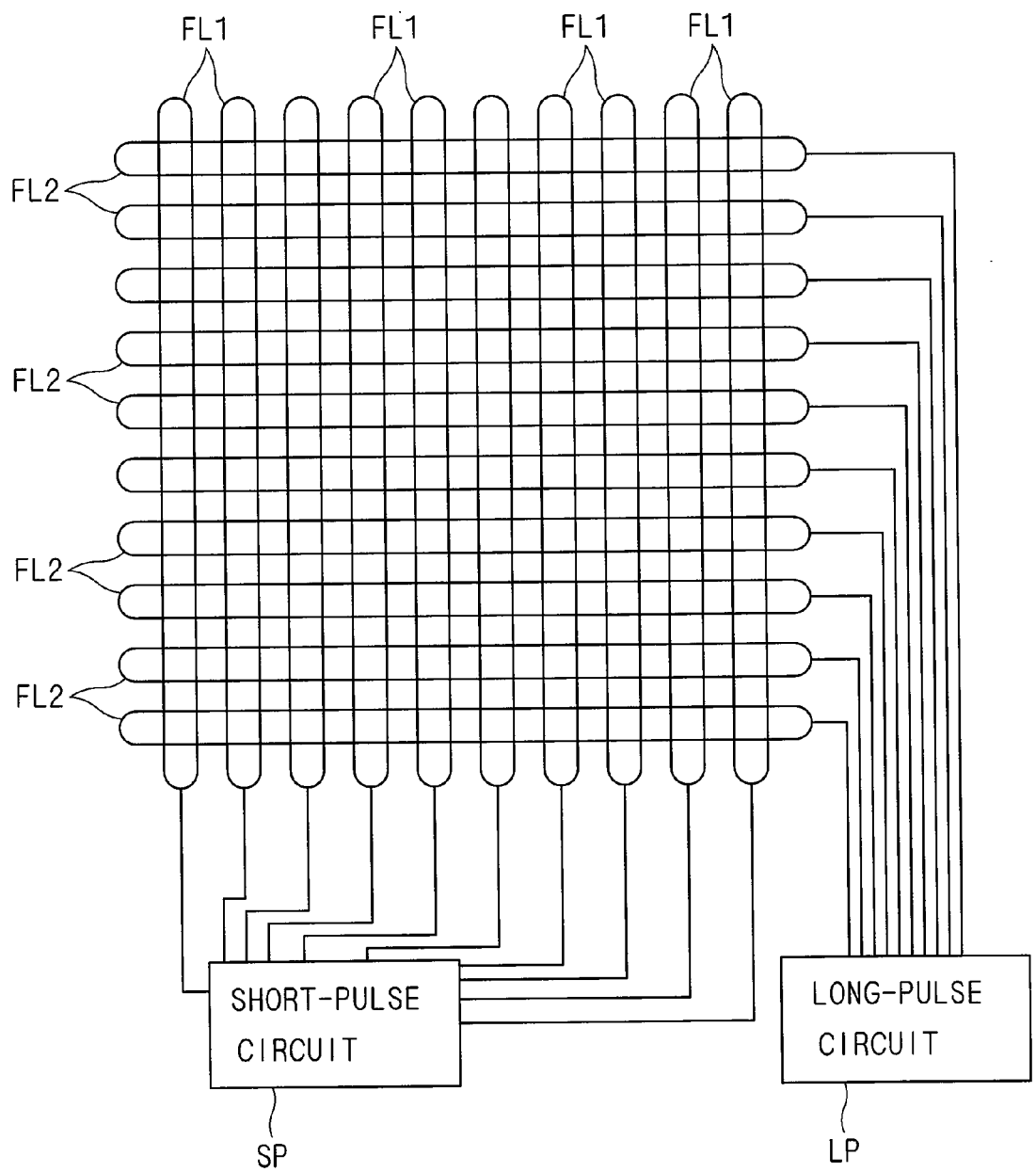
FIG. 11 is a diagram showing an arrangement of a plurality of flash lamps in a second preferred embodiment.

FIG. 11 shows the arrangement of a plurality of flash lamps FL in the second preferred embodiment. In the second preferred embodiment, the flash lamps FL1 and the flash lamps FL2 are arranged to intersect with one another in the form of parallel crosses. Specifically, the plurality of flash lamps FL are divided into two lamp groups each consisting of an equal number of flash lamps FL, one of the lamp groups (a first lamp group) being connected to the short-pulse circuits SP and the other of the lamp groups (a second lamp group) being connected to the long-pulse circuits LP. The flash lamps FL1 forming the first lamp group are arranged in a plane in parallel with one another in a horizontal direction. Also, the flash lamps FL2 forming the second lamp group are arranged in a plane in parallel with one another in a horizontal direction. Then, the plane of arrangement of the first lamp group and the plane of arrangement of the second lamp group are superimposed on each other so that the flash lamps FL1 and the flash lamps FL2 intersect with one another in the form of parallel crosses. The short-pulse circuits SP and the long-pulse circuits LP are identical to those in the first preferred embodiment, and the remaining part of the construction other than the arrangement of the flash lamps FL is the same as that in the first preferred embodiment. Note that either one of the arrangements of the flash lamps FL1 and FL2 may be overlaid on top of the other.

Even with the crossing arrangement as in the second preferred embodiment, the flash of light emitted from the flash lamps FL1 and the flash of light emitted from the flash lamps FL2 are uniformly superimposed on one another on the whole surface of the semiconductor wafer W held by the holder 7 in the treatment position. Consequently, the light intensity in the surface of the semiconductor wafer W since the start of light emission transitions as shown in FIG. 9, and the surface temperature of the semiconductor wafer W transitions as shown in FIG. 10. In other words, if, as in the second preferred embodiment, the flash lamps FL1 with short pulse widths and the flash lamps FL2 with long pulse widths are arranged to intersect with one another in the form of parallel crosses, the flash of light with a high peak intensity from the flash lamps FL1 and the flash of light with a gentle peak from the flash lamps FL2 are uniformly superimposed on one another on the whole surface of the semiconductor wafer W, and the temperature of even a deep portion of the semiconductor wafer W can be increased to the activation temperature or more without heating a shallow portion near the surface of the semiconductor wafer W more than necessary. This achieves the activation of a deep junction without causing warpage or cracking of the semiconductor wafer W.

<3. Third Preferred Embodiment>

Next, a third preferred embodiment of the invention is described. The overall construction of a heat treatment apparatus of the third preferred embodiment is generally the same as that of the first preferred embodiment shown in FIGS. 1 and 5, and the procedure for the treatment of the semiconductor wafer W in the heat treatment apparatus of the third preferred embodiment is also the same as that described in the first preferred embodiment. The heat treatment apparatus of the third preferred embodiment differs from that of the first preferred embodiment in the shape and arrangement of the flash lamps FL.

FIG. 12 shows the arrangement of a plurality of flash lamps FL in the third preferred embodiment. While, in the first and second preferred embodiments, the flash lamps FL are rod-like lamps each including the cylindrical glass tube 92, the flash lamps FL in the third preferred embodiment are point source lamps (e.g., spherical lamps). The plurality of point source lamps or flash lamps FL are divided into two lamp groups each consisting of an equal number of flash lamps FL. One of the lamp groups (a first lamp group) is connected to the short-pulse circuits SP, and the other of the lamp groups (a second lamp group) is connected to the long-pulse circuits LP in the same manner as in the first and second preferred embodiment. In the third preferred embodiment, the flash lamps FL1 and the flash lamps FL2 are alternately arranged both in the longitudinal and lateral directions. In other words, the flash lamps FL1 and the flash lamps FL2 are arranged in a checkered pattern. The short-pulse circuits SP and the long-pulse circuits LP are the same as those in the first preferred embodiment, and the remaining part of the construction other than the shape and arrangement of the flash lamps FL is the same as that in the first preferred embodiment.

Even with the lamp arrangement as in the third preferred embodiment, the flash of light emitted from the flash lamps FL1 and the flash of light emitted from the flash lamps FL2 are uniformly superimposed on one another on the whole surface of the semiconductor wafer W held by the holder 7 in the treatment position. Consequently, the light intensity in the surface of the semiconductor wafer W since the start of light emission transitions as shown in FIG. 9, and the surface temperature of the semiconductor wafer W transitions as shown in FIG. 10. In other words, if, as in the third preferred embodiment, the flash lamps FL1 with short pulse widths and the flash lamps FL2 with long pulse widths are arranged in a checkered pattern, the flash of light with a high peak intensity from the flash lamps FL1 and the flash of light with a gentle peak from the flash lamps FL2 are uniformly superimposed on one another on the whole surface of the semiconductor wafer W, and the temperature of even a deep portion of the semiconductor wafer W can be increased to the activation temperature or more without heating a shallow portion near the surface of the semiconductor wafer W more than necessary. This achieves the activation of a deep junction without causing warpage or cracking of the semiconductor wafer W.

<4. Modifications>

Figure 13:
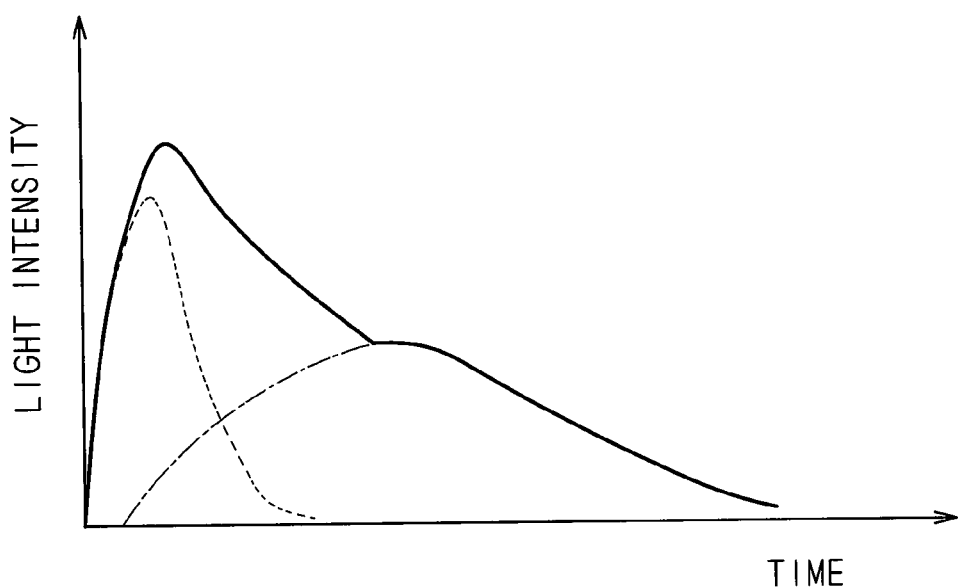
FIG. 13 shows one example of the transition of the light intensity in the case where flash lamps with different pulse widths start light emission with different timing.

Although the preferred embodiments according to the invention have been described hereinabove, various modifications in addition to the above can be made therein without departing from the spirit and scope of the invention. For example, while in the preferred embodiments described above, the start timing of light emission from the flash lamps FL1 and the start timing of light emission from the flash lamps FL2 are simultaneous with each other, they may differ. FIG. 13 illustrates the transition of the light intensity in the surface of the semiconductor wafer W in the case where the start timing of light emission from the flash lamps FL1 with short pulse widths is earlier than the start timing of light emission from the flash lamps FL2 with long pulse widths. More specifically, the controller 3 controls the trigger control circuit 38 so that, after the trigger switches SW in the short pulse circuits SP connected to the flash lamps FL1 are turned on, then the trigger switches SW in the long pulse circuits LP connected to the flash lamps FL2 are turned on.

Figure 14:
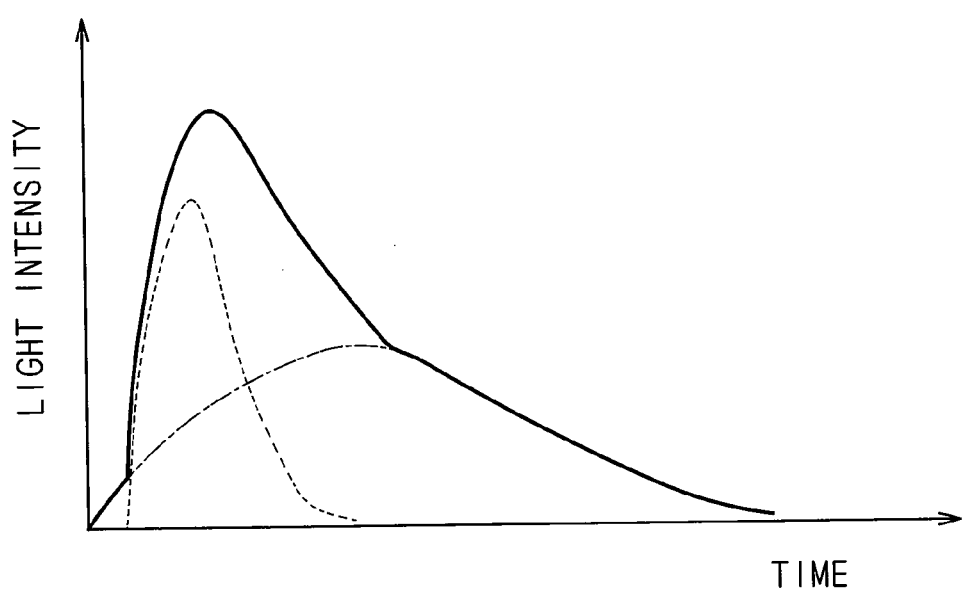
FIG. 14 shows another example of the transition of the light intensity in the case where flash lamps with different pulse widths start light emission with different timing.

On the other hand, FIG. 14 illustrates the transition of the light intensity in the surface of the semiconductor wafer W in the case where the start timing of light emission from the flash lamps FL1 with short pulse widths is later than the start timing of light emission from the flash lamps FL2. More specifically, the controller 3 controls the trigger control circuit 38 so that, after the trigger switches SW in the long pulse circuits LP connected to the flash lamps FL2 are turned on, then the trigger switches SW in the short pulse circuits SP connected to the flash lamps FL1 are turned on. In FIGS. 13 and 14, as in FIG. 9, the dotted lines indicate the intensity of the flash of light from the flash lamps FL1 with short pulse widths; the long and short dashed lines indicate the intensity of the flash of light from the flash lamps FL2 with long pulse widths; and the solid lines indicate the light intensity obtained by superimposing both the light intensities. The arrangement of the flash lamps FL may be any of those in the first to third preferred embodiments described above.

Even if the flash lamps FL1 and the flash lamps FL2 start light emission with different timing as shown in FIGS. 13 and 14, the flash of light with a high peak intensity from the flash lamps FL1 and the flash of light with a gentle peak from the flash lamps FL2 are uniformly superimposed on one another, so that the temperature of even a deep portion of the semiconductor wafer W can be increased to the activation temperature or more without heating a shallow portion near the surface of the semiconductor wafer W more than necessary. This achieves the activation of a deep junction without causing warpage or cracking of the semiconductor wafer W. Besides, it is possible, according to differences in the start timing of light emission, to adjust as appropriate the depth of a portion whose temperature is increased to the activation temperature or more, and the surface temperature of the semiconductor wafer W. This produces a wide range of variations of the heat treatment pattern.

The pattern of arrangement of the flash lamps FL are not limited to those in FIGS. 7, 11, and 12, and various patterns can be adopted. However, an uneven distribution of the flash lamps FL1 with short pulse widths or the flash lamps FL2 with long pulse widths (e.g., referring to FIG. 7, only the flash lamps FL1 are arranged on the right half of the space and only the flash lamps FL2 on the left half) results in uneven activation because an area irradiated with only a flash of light with a high peak intensity and an area irradiated with only a flash of light with a gentle peak are produced on the surface of the semiconductor wafer W. For this reason, the lamp arrangements as shown in FIGS. 7, 11, and 12 are preferable, in which the flash of light with a high peak intensity from the flash lamps FL1 and the flash of light with a gentle peak from the flash lamps FL2 are uniformly superimposed on one another.

While, in the preferred embodiments described above, the flash lamps FL1 and the flash lamps FL2 are equal in number, the invention is not limited thereto and either of the flash lamps FL1 and FL2 may be large in number. In other words, the construction may be such that the first lamp group consisting of part of a plurality of flash lamps is connected to the short-pulse circuits SP, and the second lamp group consisting of the remainder of the flash lamps are connected to the long-pulse circuits LP.

In each of the short-pulse circuits SP and the long-pulse circuits LP in the preferred embodiments described above, the power supply unit 95 shown in the configuration of FIG. 6 is a constant-voltage power supply to supply a certain constant voltage to the capacitor 93, but the invention is not limited thereto. The power supply unit 95 in each of the short-pulse circuits SP and the long-pulse circuits LP may be a variable-voltage power supply so that a desired voltage can be applied to the capacitor 93 thereby to make variable a charge voltage stored in the capacitor 93. In such a configuration, by making variable the value of power supply voltage supplied from the power supply unit 95, the short-pulse circuits SP and the long-pulse circuits LP can have more discretion in setting the charge voltage to be stored in their respective capacitors 93. Thus, the amount of discharge in each of the short-pulse circuits SP and the long-pulse circuits LP can be changed by any combination of the charge voltages stored in the short-pulse circuits SP and the long-pulse circuits LP. This makes it possible to vary the intensity of light discharged from the flash lamps FL1 connected to the short-pulse circuits SP and the intensity of light discharged from the flash lamps FL2 connected to the long-pulse circuits LP. Combining this with the aforementioned step of varying the duration of light emission gives the apparatus according to the invention more discretion in applying to the semiconductor wafer W the required amount of heat for the required amount of time and in thereby activating an area at a desired depth below the surface of the semiconductor wafer W in accordance with the required process.

The flash lamps FL are not limited to xenon flash lamps but may be krypton flash lamps.

While the hot plate 71 is used as an assist-heating element in the preferred embodiments described above, a plurality of lamp groups (e.g., a plurality of halogen lamps) may be provided under the holder 7 which holds the semiconductor wafer W to emit light therefrom, thereby achieving assist-heating.

In the preferred embodiments described above, the ion activation process is performed by irradiating the semiconductor wafer with light, but the invention is not limited thereto. For example, the heat treatment apparatus according to the invention may be used in the construction of forming a cobalt silicide layer or a nickel silicide layer, thereby forming a silicide layer with sufficient film thickness. Further, a substrate to be treated by the heat treatment apparatus according to the invention is not limited to a semiconductor wafer. For example, the heat treatment apparatus according to the invention may perform heat treatment on a glass substrate formed with various silicon films including a silicon nitride film, a polycrystalline silicon film, and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus according to the invention may irradiate the entire surface of the amorphous silicon film with light to polycrystallize the amorphous silicon film, thereby forming a polycrystalline silicon film.

As another alternative, the heat treatment apparatus according to the invention can perform light irradiation on a TFT substrate constructed in such a way that an underlying silicon oxide film and a polysilicon film that is produced by crystallization of amorphous silicon are formed on a glass substrate and the polysilicon film is doped with impurities such as phosphorus or boron, thereby activating the impurities implanted in the doping step.

While the invention has been described in detail, the foregoing description is in all aspects illustrative and not restrictive. It is understood that numerous other modifications and variations can be devised without departing from the scope of the invention.

What is claimed is:

1. A heat treatment method irradiating a substrate with flashes of light from flash lamps to heat the substrate, comprising:
   (a) a first irradiation step of irradiating said substrate with a flash of light of a first pulse, said first irradiation step is started at a first time; and
   (b) a second irradiation step of irradiating said substrate with a flash of light of a second pulse, said second irradiation step is started at a second time later than said first time;
   wherein,
   at least a part of the irradiation of a flash of light of said second irradiation step is superimposed on the irradiation of a flash of light of said first irradiation step, and
   the surface temperature of said substrate is increased to a treatment temperature of a predetermined value by the irradiation of the flash of light of said first irradiation step, and the surface temperature of said substrate is maintained at said treatment temperature equal to said predetermined value for not less than a predetermined duration of time by the irradiation of the flash of light of said second irradiation step.

2. A heat treatment method irradiating a substrate with flashes of light to heat the substrate, comprising:
   (a) a first irradiation step of irradiating said substrate with a flash of light from a first flash lamp, said first irradiation step is started at a first time; and
   (b) a second irradiation step of irradiating said substrate with a flash of light from a second flash lamp, said second irradiation step is started at a second time later than said first time;
   wherein,
   at least a part of the irradiation of a flash of light of said second irradiation step is superimposed on the irradiation of a flash of light of said first irradiation step, and the surface temperature of said substrate is increased to a treatment temperature of a predetermined value by the irradiation of the flash of light of said first irradiation step, and the surface temperature of said substrate is maintained at said treatment temperature equal to said predetermined value for not less than a predetermined duration of time by the irradiation of the flash of light of said second irradiation step.

* * * * *